United States Patent [19]
Watanabe et al.

[11] Patent Number: 5,375,231
[45] Date of Patent: Dec. 20, 1994

[54] CONTROL MEMORY ERROR CORRECTING APPARATUS

[75] Inventors: Shinji Watanabe, Tokyo; Hirokazu Ishizaka, Yamanashi, both of Japan

[73] Assignee: NEC Corporation, Tokyo, Japan

[21] Appl. No.: 767,390

[22] Filed: Sep. 30, 1991

[30] Foreign Application Priority Data

Oct. 1, 1990 [JP] Japan ................................. 2-264397

[51] Int. Cl.⁵ ...................... G06F 11/34; H03H 13/00
[52] U.S. Cl. .................................. 395/575; 371/40.1
[58] Field of Search ...................... 371/22.5, 25.1, 17,
371/27, 37.1, 40.1, 5.1, 41.1, 8.1, 10.1, 10.2,
10.3, 42, 2.2, 21.1, 38.1, 16.1, 16.5; 395/575,
400, 800, 200, 275, 375; 364/232.8, 244.6, 247.2,
247.6, 935.2, 946.6, 957.1

[56] References Cited

U.S. PATENT DOCUMENTS

| | | | |
|---|---|---|---|
| 4,293,950 | 10/1981 | Shinizu et al. | 371/21 |
| 4,521,872 | 6/1985 | Sawada et al. | 365/189 |
| 4,580,240 | 4/1986 | Watanabe | 364/900 |
| 4,644,539 | 2/1987 | Sato | 371/211 |
| 4,701,915 | 10/1987 | Kitamura et al. | 371/13 |
| 4,955,023 | 9/1990 | Tamimoto | 371/40.1 |
| 5,212,693 | 5/1993 | Ohao et al. | 371/10.1 |

FOREIGN PATENT DOCUMENTS

| | | |
|---|---|---|
| 392563 | 10/1990 | European Pat. Off. |
| 2611936 | 9/1988 | France |
| 2089538 | 6/1982 | United Kingdom |

OTHER PUBLICATIONS

Fotland, D. A., "An Adaptable 1-MIPS Real-Time Computer", 1266 Hewlett Packard Journal, vol. 35, Feb. 1984, No. 2, Amstelveen, Nederland.

Primary Examiner—Robert W. Beausoliel, Jr.
Assistant Examiner—Dieu-Minh Le
Attorney, Agent, or Firm—Foley & Lardner

[57] ABSTRACT

A control memory error correcting apparatus includes a control memory, a microinstruction register, a control pattern generator, a control pattern storage register, and an operation inhibit signal generator. The control memory stores a microinstruction including a first field for controlling a first operation unit by a microinstruction pattern and a second field for generating a control pattern for controlling a second operation unit. The microinstruction register stores the microinstruction from the control memory. The control pattern generator generates the control pattern in accordance with the second field from the microinstruction register. The control pattern storage register stores the control pattern from the control pattern generator. The operation inhibit signal generator changes timings and destinations of the operation inhibit signals output to the first and second operation units and the control pattern storage register in accordance with the types of the error-detected fields when a correctable error is detected in any of the first and second fields stored in the microinstruction register.

7 Claims, 6 Drawing Sheets

CONTROL MEMORY ERROR CORRECTING APPARATUS

BACKGROUND OF THE INVENTION

The present invention relates to a microprogram control apparatus in an information processing apparatus and, more particularly, to a control memory error correcting apparatus having functions of detecting/correcting an operation of a correctable error and inhibiting an operation of an operation unit during an error detection.

A conventional example will be described below with reference to the accompanying drawings.

FIG. 4 shows an arrangement of the conventional microprogram control apparatus. Referring to FIG. 4, a microinstruction is stored in a control memory 21. This microinstruction is constituted by the following components: an address field A representing next address information; an arithmetic control field B for causing a pattern of the microinstruction to directly control an arithmetic circuit 25; a control pattern field C for generating a control pattern of an arithmetic circuit 26; and an error correcting code according to a Hamming code given to a series of bit patterns. The microinstruction read out from the control memory 21 is stored in a microinstruction register 22.

The control pattern field C of the microinstruction stored in the microinstruction register 22 is input to a control pattern generator 23. The control pattern generator 23 generates a control pattern in accordance with the microinstruction represented by the control pattern field C, and inputs/stores it in a control pattern storage register 24. The control pattern storage register 24 outputs the stored control pattern to the arithmetic circuit 26 to control it. Two typical methods of generating a control pattern will be shown below with reference to FIGS. 6 and 7. FIG. 6 shows a hardware decoding method for causing a decoder 72 to decode a second field of a microinstruction, thereby obtaining a control pattern. FIG. 7 shows a RAM decoding method of obtaining a control pattern from a control pattern memory 73 by using the second field of the microinstruction as an address. By using the above methods, the control pattern can be obtained. The arithmetic circuit 26 stores an arithmetic result in an arithmetic result register 30.

The arithmetic control field B of the microinstruction stored in the microinstruction register 22 is input to the arithmetic circuit 25. The arithmetic circuit 25 performs the operation in accordance with the microinstruction represented by the arithmetic control field B, and inputs/stores the arithmetic result in an arithmetic result storage register 29. Note that the arithmetic circuit 25 and the arithmetic result storage register 29 constitute an operation unit 33, and the arithmetic circuit 26 and the arithmetic result storage register 30 constitute an operation unit 34.

If error detectors 271 to 273 in an operation inhibit signal generator 27 detect errors in any of the address field A, the arithmetic control field B, and the control pattern field C of the microinstruction stored in the microinstruction register 22, the detectors 271 to 273 generate an operation inhibit signal D through an OR circuit 274 and inhibit the updating of the control pattern storage register 24 and the arithmetic result storage registers 29 and 30 in the operation units 33 and 34. Therefore, these registers are not adversely affected by the microinstruction including the errors. The error correction circuit 28 corrects the error of the microinstruction and stores it in the microinstruction register 22 during the generation of the operation inhibit signal.

A series of the above operations will be described below with reference to the timing chart shown in FIG. 5. When an error-including microinstruction $Ei'$ is stored in the microinstruction register 22, the operation inhibit signal D is generated, updating of the control pattern storage register 24 and the arithmetic result storage registers 29 and 30 is inhibited, and the registers 24, 29 and 30 respectively keep holding data $F1_{i-1}$, $R1_{i-1}$ and $R2_{i-2}$. An error-corrected microinstruction $Ei$ is stored in the microinstruction register 22 in the next clock cycle. The operation inhibit signal D is canceled and a normal operation restarts. Therefore, operations of the control pattern storage register 24 and the arithmetic result storage registers 29 and 30 are not adversely affected by the microinstruction $Ei'$ and can be properly performed.

In the control memory error correcting apparatus of this type, the correctable error is detected in all fields of the microinstruction and the updating of the control pattern storage register 24 and the arithmetic result storage registers 29 and 30 in the operation units 33 and 34 is inhibited in an error-detected clock cycle.

In the conventional control memory error correcting apparatus as described above, the correctable error is detected in all fields of the microinstruction and the operation of the operation units is inhibited in an error-detected clock cycle.

A microprogram control apparatus, generally, comprises a plurality of LSIs. Some LSIs are arranged near an arithmetic circuit, and some LSIs are arranged away from an arithmetic circuit. The microinstruction register is realized by the plurality of LSIs in a distributed manner. For this reason, when an error is detected in all the fields of the microinstruction and the operation inhibit signal D is generated, the delay time of the operation inhibit signal D during its propagation from the microinstruction register 22 of the remote LSI to the control pattern storage register 24 and the arithmetic result storage registers 29 and 30 is prolonged. Therefore, the clock cycle is also prolonged.

SUMMARY OF THE INVENTION

It is a principal object of the present invention to provide a control memory error correcting apparatus for preventing a clock cycle from being adversely affected by a delay of an operation inhibit signal.

It is another object of the present invention to provide a control memory error correcting apparatus for, if an error is generated in any of the fields in a microinstruction, preventing an operation unit from being adversely affected by the error.

In order to achieve the above objects, according to the present invention, there is provided a control memory error correcting apparatus comprising a control memory for storing a microinstruction including a first field for controlling a first operation unit by a microinstruction pattern and a second field for generating a control pattern for controlling a second operation unit, a microinstruction register for storing the microinstruction from the control memory, a control pattern generator for generating the control pattern in accordance with the second field from the microinstruction register, a control pattern storage register for storing the control pattern from the control pattern generator, and an operation inhibit signal generator for changing timings and destinations of the operation inhibit signals output to the first and second operation units and the control pattern storage register in accordance with the types of error-detected fields when a correctable error is detected in any of the first and second fields stored in the microinstruction register.

DESCRIPTION OF THE PREFERRED EMBODIMENT

The present invention will be described below with reference to the accompanying drawings.

Figure 1:
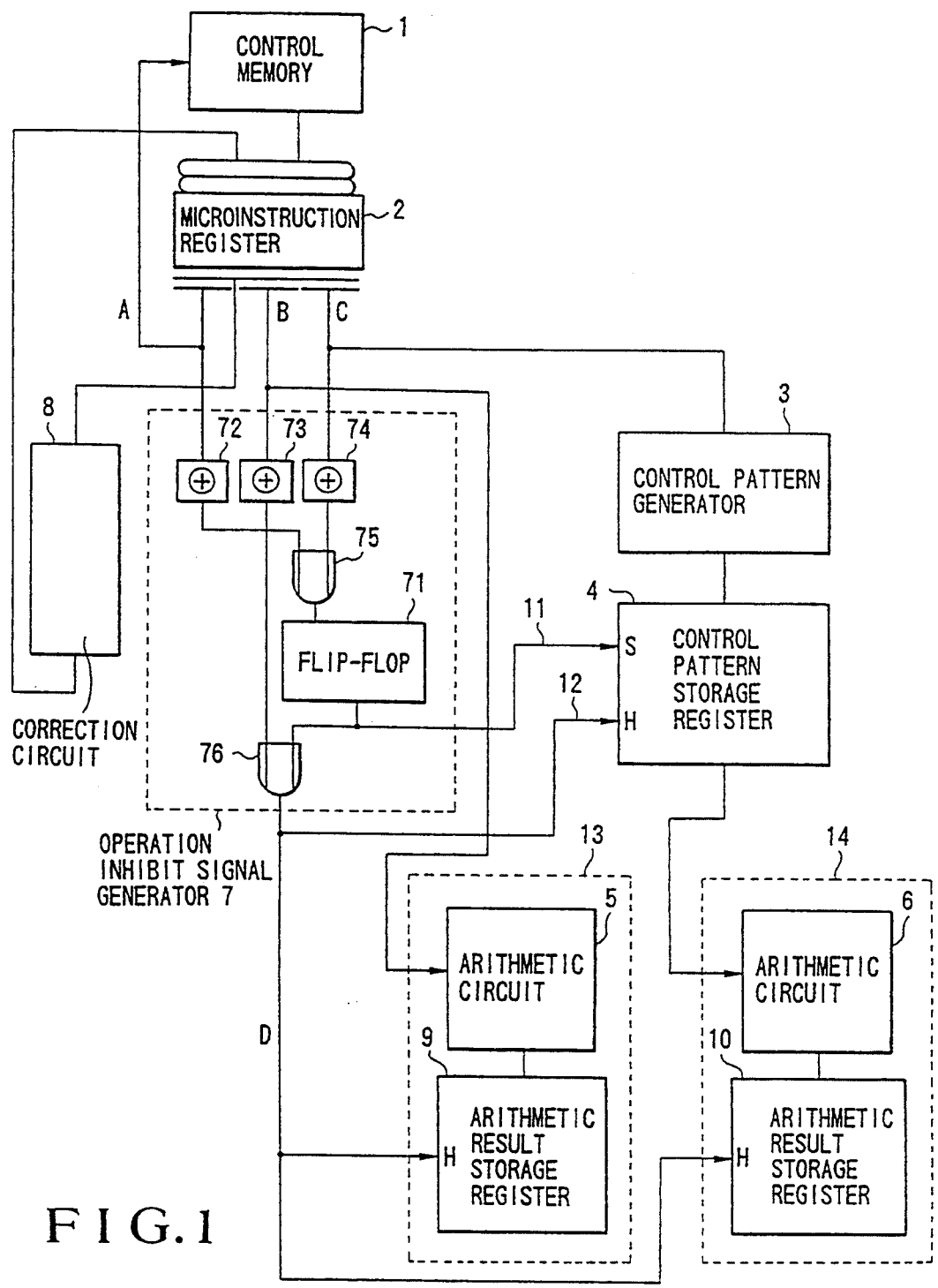
FIG. 1 is a block diagram showing an embodiment of the present invention.
Figure 4:
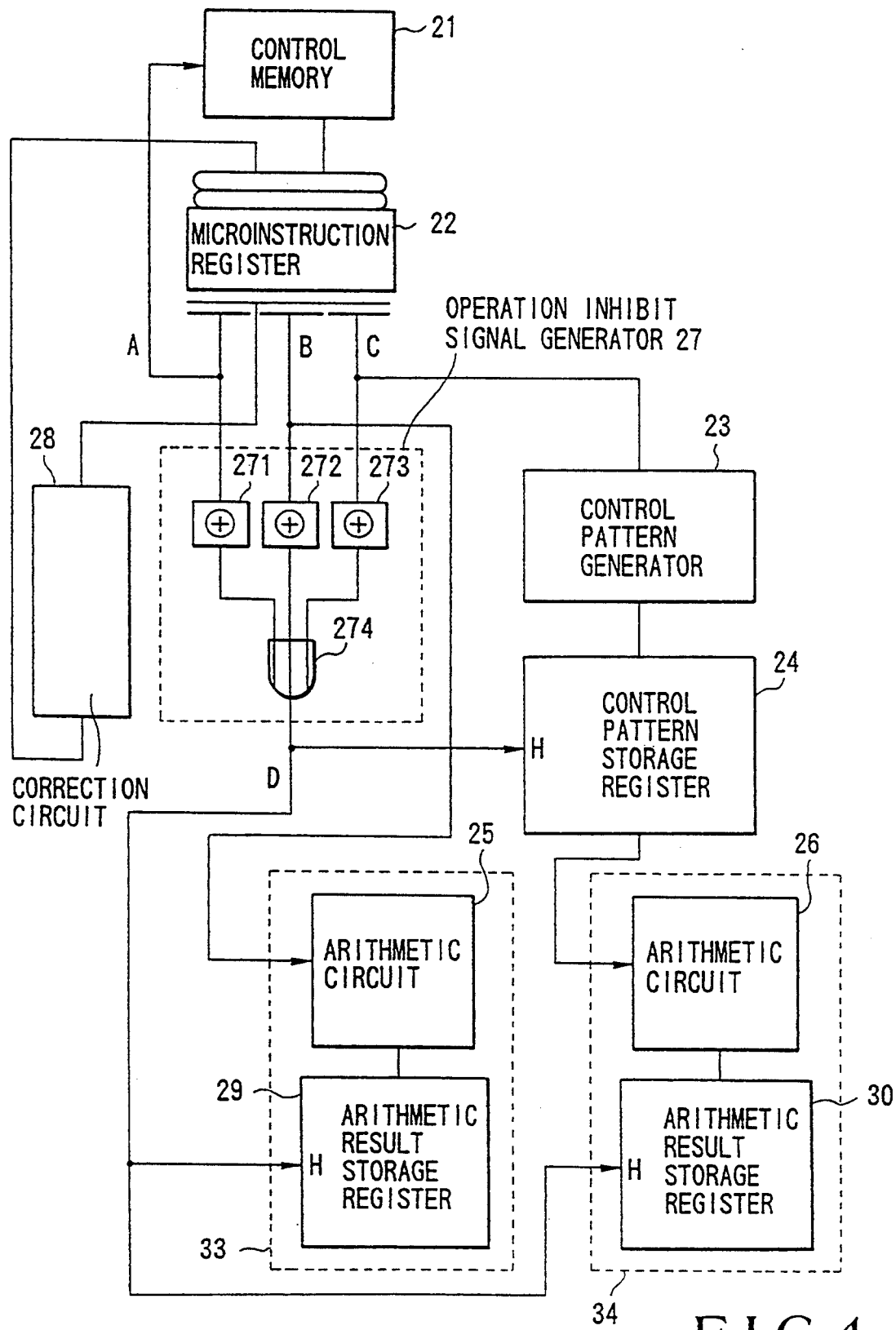
FIG. 4 is a block diagram showing a conventional example.
Figure 5:
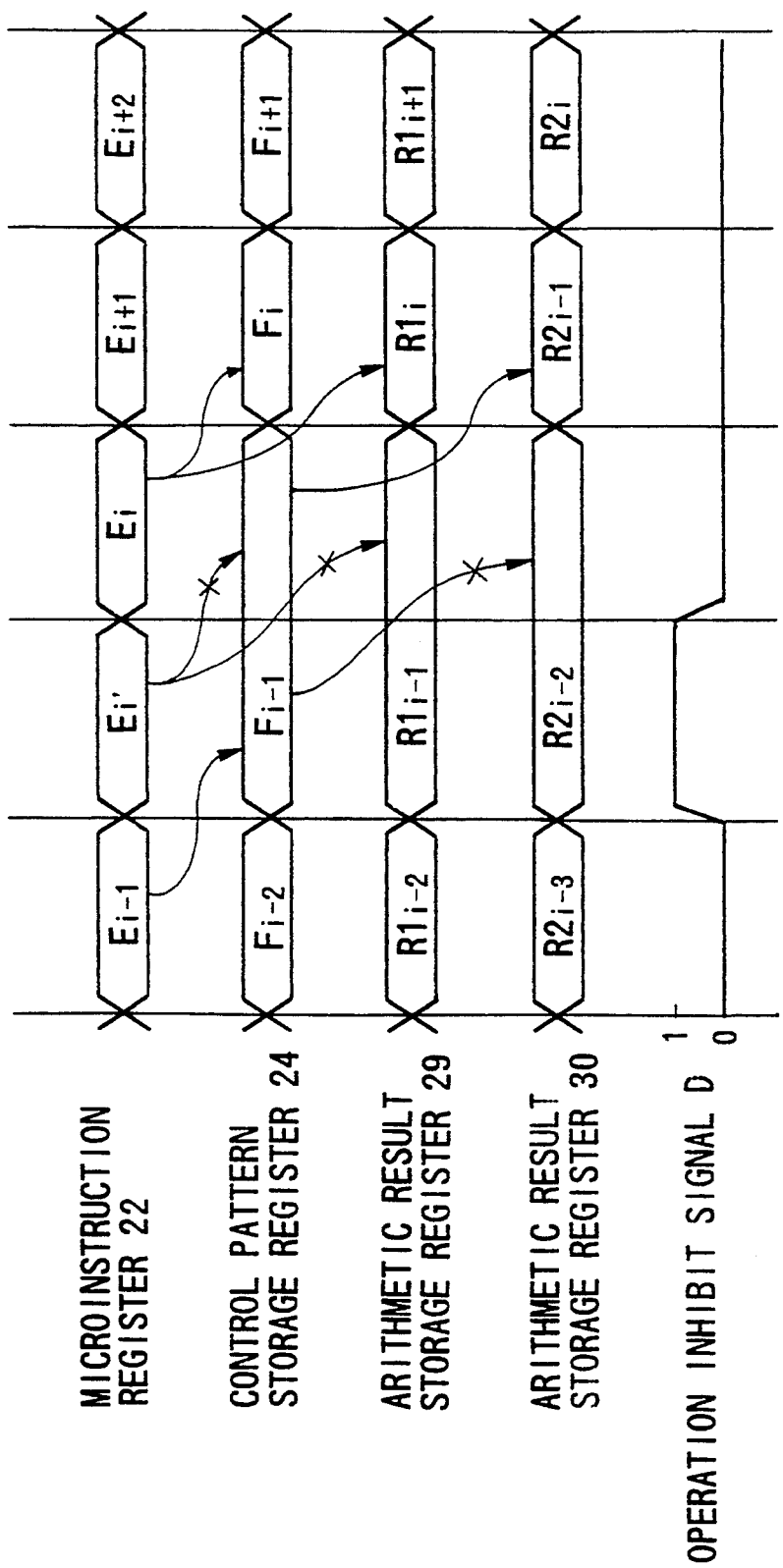
FIG. 5 is a timing chart for explaining an operation of a conventional example.
Figure 6:
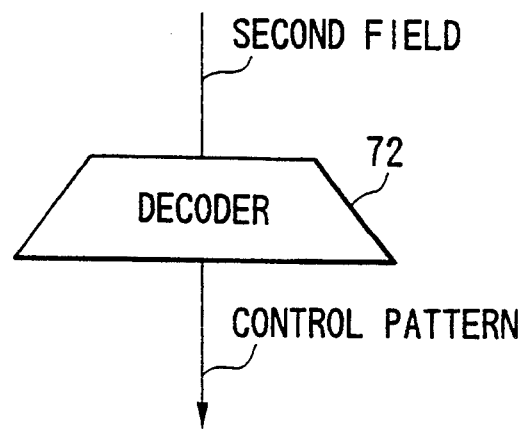
FIGS. 6 and 7 are block diagrams showing detailed arrangement of a control pattern generator of the embodiment of the present invention and a conventional control pattern generator, respectively.
Figure 7:
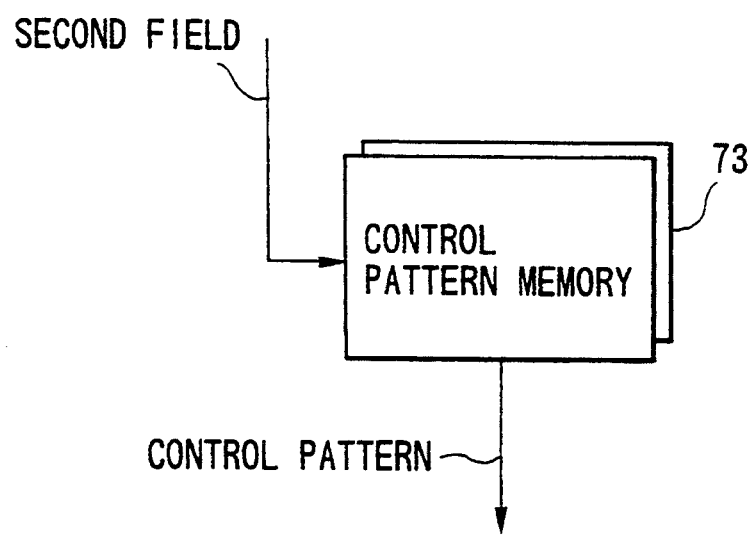

FIG. 1 is a block diagram showing an embodiment of the present invention. The same blocks in FIG. 1 have the same functions as in the conventional example of FIG. 4, except for an operation inhibit signal generator 7, and a detailed description thereof will be omitted. Error detectors 72 to 74 in the operation inhibit signal generator 7 output an operation inhibit signal D to an operation inhibit signal line 12 through an OR circuit 76 in a clock cycle when an error is detected in an arithmetic control field B as a first field of the microinstruction stored in a microinstruction register 2. Updating of a control pattern storage register 4 and arithmetic result storage registers 9 and 10 in operation units 13 and 14 is inhibited. Furthermore, when an error is detected in a control pattern field C as a second field of the microinstruction or an address field A by the error detectors 72 to 74, a flip-flop 71 is set through an OR circuit 75. The flip-flop 71 holds a signal representing the presence of an error during one clock cycle and outputs the operation inhibit signal D through the OR circuit 76. The updating of the control pattern storage register 4 and the arithmetic result storage registers 9 and 10 is inhibited. However, when an error is detected in the control pattern field C as the second field of the microinstruction, the control pattern stored in the control pattern storage register 4 is an erroneous control pattern generated by a control pattern generator 3 in accordance with a microinstruction including an error. Therefore, if the control pattern storage register 4 keeps holding this control pattern, the arithmetic circuit 6 in the operation unit 14 is erroneously controlled at the end of the operation inhibit signal D. The erroneous arithmetic result is stored in the arithmetic result storage register 10. For this reason, the control pattern generated in accordance with the microinstruction including the corrected error needs to be stored in the control pattern storage register 4 in the clock cycle next to the error-detected clock cycle. In order to realize this, a set signal is output to the control pattern storage register 4 through a set signal line 11 and the control pattern generated in accordance with the error-corrected microinstruction is stored in the control pattern storage register 4 even if the operation inhibit signal D is being output. The error of the microinstruction does not adversely affect the arithmetic circuit 6 so that the microprogram control apparatus can be properly performed.

The above operation will be described with reference to timing charts by a case in which an error is detected in the arithmetic control field B as the first field of the microinstruction stored in the microinstruction register 2, and a case in which an error is detected in the arithmetic control field C as the second field.

Figure 2:
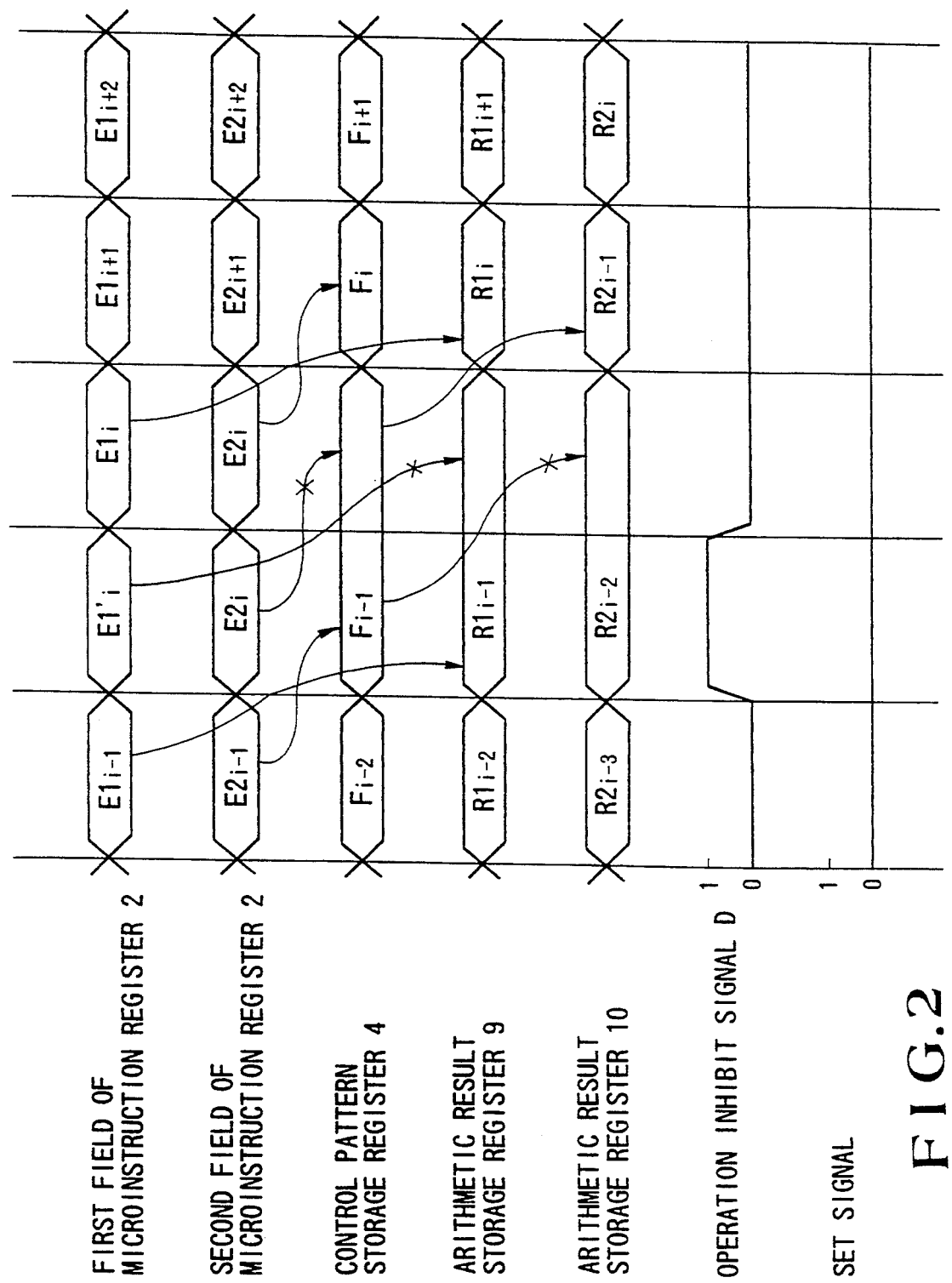
FIGS. 2 and 3 are timing charts for explaining an operation of the present invention.
Figure 3:
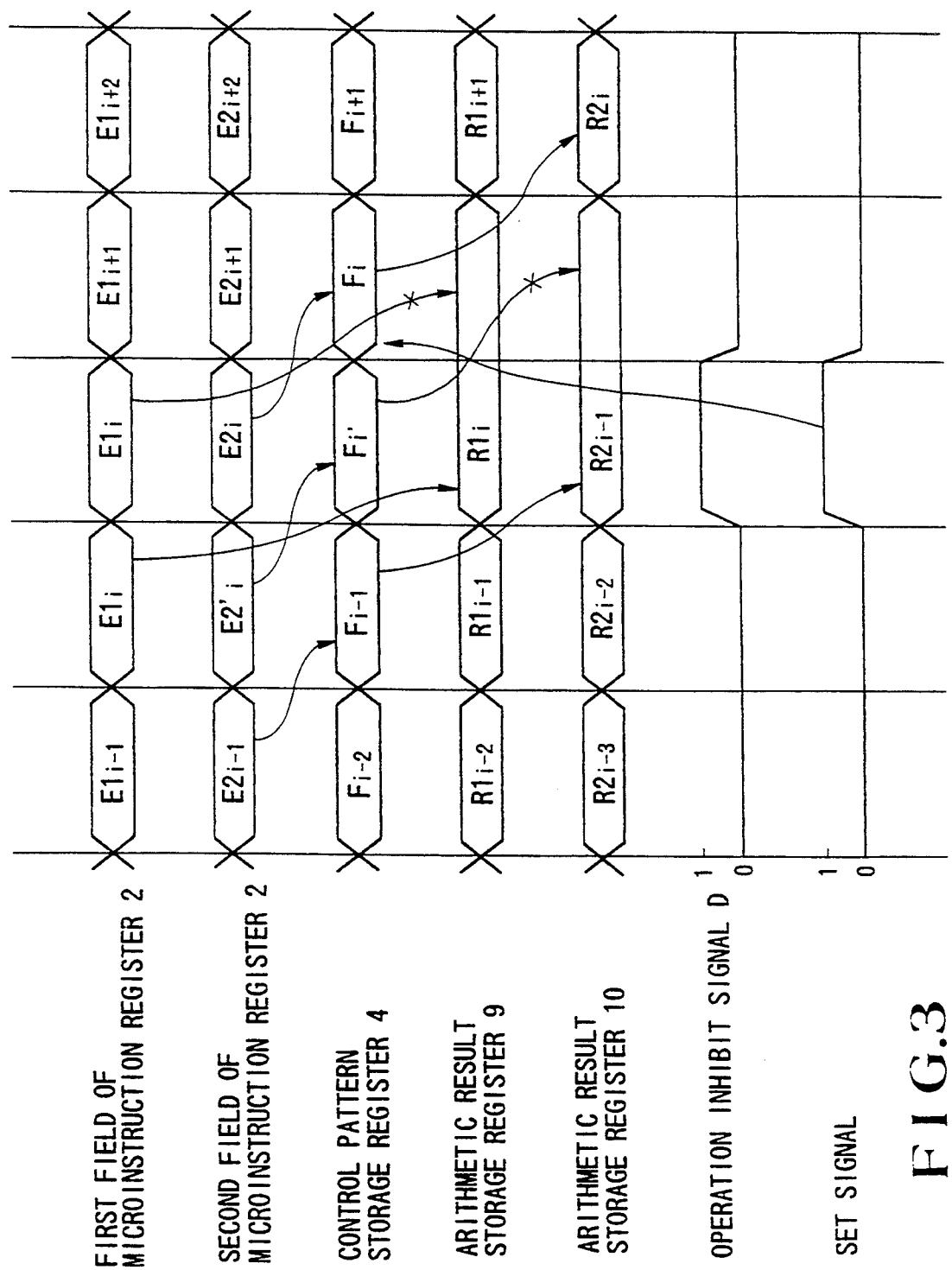

FIG. 2 is a timing chart obtained when an error is detected in the arithmetic control field B as the first field of the microinstruction, and FIG. 3 is a timing chart obtained when an error is detected in the arithmetic control field C as the second field.

In FIG. 2, when a microinstruction Eli' including an error in the first field of the microinstruction is stored in the microinstruction register 2, the operation inhibit signal D is output in the same clock cycle. Since the error is an error in the first field of the microinstruction, a set signal is not output. For this reason, updating of the control pattern storage register 4 and the arithmetic result storage registers 9 and 10 is inhibited by the operation inhibit signal D and the registers 4, 9 and 10 respectively keep holding data $F1_{i-1}$, $R1_{i-1}$ and $R2_{i-2}$ until the clock cycle next to the error-detected clock cycle. The operation inhibit signal D is canceled in the clock cycle next to the error-detected clock cycle and each of the registers 4, 9 and 10 are updated. Therefore, the arithmetic circuit 5 controlled by the first field of the microinstruction is not adversely affected by the error and can be properly operated.

In FIG. 3, when a microinstruction E2i' including an error in the control field B as the second field of the microinstruction is stored in the microinstruction register 2, the error is detected in the same clock cycle and the operation inhibit signal D is output from the next clock cycle to the second succeeding clock cycle. A set signal line 11 outputs a set signal from the first succeeding clock cycle of the error-detected clock cycle to the second succeeding clock cycle so as to cancel the operation inhibit signal D in the control pattern storage register 4. The set signal causes the control pattern storage register 4 not to keep holding a control pattern Fi' generated by the microinstruction E2i' including an error until the next clock cycle. The control pattern Fi generated by the new error-corrected microinstruction E2i is stored. Therefore, the arithmetic circuit 6 controlled by the control pattern is not adversely affected by the error in the second field of the microinstruction from the microinstruction register 2 and can be properly operated.

As has been described above, an LSI arranged near the arithmetic circuit is assigned the arithmetic control field as the first field of the microinstruction and an LSI arranged away from the arithmetic circuit is assigned the control pattern field as the second field of the microinstruction. When an error is detected in the first field, the operation inhibit signal reaches the arithmetic circuit within a short delay time since the first field is near the arithmetic circuit. When an error is detected in the second field, although the second field is away from the arithmetic circuit, the operation inhibit signal may reach the arithmetic circuit by the clock cycle next to the error-detected clock cycle. Therefore, since one flip-flop can be arranged midway along the path to the arithmetic circuit, no problem occurs due to the delay time by the operation inhibit signal. According to the present invention, the limit in the clock cycles of the microprogram control apparatus and the arithmetic circuit related to the delay time by the operation inhibit signal is prevented.

What is claimed is:

1. A control memory error correcting apparatus comprising:
   a first operation unit;
   a second operation unit;
   a control memory for storing a microinstruction including a first field for controlling said first operation unit, a second field for generating a control pattern for controlling said second operation unit and a third field having an error detecting and correcting code and an address of a microinstruction to be executed subsequently;
   a microinstruction register for storing the microinstruction from said control memory, designating a microinstruction address to be read subsequently from said control memory by the third field of the stored microinstruction and controlling said first operation unit by the first field of the stored microinstruction;
   a control pattern generator for generating a control pattern for controlling said second operation unit in accordance with said second field from said microinstruction register at a clock cycle next to a clock cycle at which said first field controls said first operation unit;
   a control pattern storage register for storing the control pattern generated by said control pattern generator and controlling said second operation unit; and
   an operation inhibit signal generator for detecting, by the error detecting and correcting code of said third field, whether an error has occurred in any of said first, second or third fields of the microinstruction stored in said microinstruction register, outputting an operation inhibit signal for inhibiting the operation of said control pattern storage register and said first and second operation units when a correctable error is detected, and outputting a cancel signal for invalidation of the operation inhibit signal to said control pattern storage register whenever the correctable error is detected in said second or third field.

2. An apparatus according to claim 1, further comprising an error correction circuit for detecting, by the error detecting and correcting code of said third field, whether an error has occurred in the microinstruction stored in said microinstruction register, and whenever an error is detected and the detected error is correctable, correcting the error and storing a corrected microinstruction in said microinstruction register.

3. An apparatus according to claim 1, wherein when the correctable error is detected in said first field stored in said microinstruction register, the operation inhibit signal is outputted from a correctable-error-detected clock cycle, and the operation inhibit signal is outputted to said first and second operation units and said control pattern storage register unit, and a microinstruction corrected for the correctable error by said error correction circuit is stored in a microinstruction register.

4. An apparatus according to claim 1, wherein when the correctable error is detected in said second or third fields, a flip-flop in said operation inhibit signal generator is set during the detection of the correctable error, an output of said flip-flop is outputted, as the operation inhibit signal, to said control pattern storage register and said first and second operation units from a clock cycle next to a correctable-error-detected clock cycle, a microinstruction corrected for the correctable error by said error correction circuit is stored in said microinstruction register, a microinstruction to be executed next to the correctable-error-detected microinstruction is stored in said microinstruction register, and the operation inhibit signal is outputted to said first and second operation units until the control pattern generated by said second field of the error-corrected microinstruction is stored in said control pattern storage register.

5. An apparatus according to claim 4, wherein said operation inhibit signal generator simultaneously outputs the operation inhibit signal and a cancel signal of the operation inhibit signal to said control pattern storage register.

6. An apparatus according to claim 1, wherein said operation inhibit signal generator comprises first means for, when the correctable error is detected in said first field, generating a first inhibit signal from a correctable-error-detected clock cycle to a next clock cycle, second means for, when the correctable error is detected in said second field, generating a second operation inhibit signal and outputting a cancel signal of the operation inhibit signal to said control pattern storage register from a first succeeding clock cycle of the correctable-error-detected clock cycle to a second succeeding clock cycle, and third means for outputting a logical sum of the first and second operation inhibit signals to said first and second operation units and said control pattern storage register.

7. An apparatus according to claim 1, wherein said cancel signal is outputted to said control pattern storage register from said operation inhibit signal generator prior to said inhibit signal being outputted to said control pattern storage register from said operation inhibit signal generator.

* * * * *